US008527189B2

(12) United States Patent
Mounetou

(10) Patent No.: US 8,527,189 B2
(45) Date of Patent: Sep. 3, 2013

(54) METHOD FOR DETECTING ELECTRIC POWER BLIPS AND MANAGING THE OPERATION OF A MOTOR

(75) Inventor: Christophe Mounetou, Malakoff (FR)

(73) Assignee: Renault S.A.S., Boulogne-Billancourt (FR)

(*) Notice: Subject to any disclaimer, the term of this patent is extended or adjusted under 35 U.S.C. 154(b) by 323 days.

(21) Appl. No.: 12/866,287

(22) PCT Filed: Jan. 23, 2009

(86) PCT No.: PCT/FR2009/050099
§ 371 (c)(1),
(2), (4) Date: Oct. 19, 2010

(87) PCT Pub. No.: WO2009/098420
PCT Pub. Date: Aug. 13, 2009

(65) Prior Publication Data
US 2011/0029223 A1    Feb. 3, 2011

(30) Foreign Application Priority Data
Feb. 5, 2008   (FR) .................................... 08 50721

(51) Int. Cl.
F02D 41/22   (2006.01)

(52) U.S. Cl.
USPC ............................ 701/114; 702/182; 702/189

(58) Field of Classification Search
USPC ......... 701/107, 114, 115; 123/406.1–406.18, 123/690, 494; 702/182, 183, 185, 189, 190
See application file for complete search history.

(56) References Cited

U.S. PATENT DOCUMENTS

| 5,937,826 | A | * | 8/1999 | Olson et al. | 123/447 |
| 6,112,724 | A | * | 9/2000 | Kotwicki et al. | 123/494 |
| 6,293,251 | B1 | * | 9/2001 | Hemmerlein et al. | 123/447 |
| 6,438,487 | B1 | * | 8/2002 | Mingo et al. | 701/113 |
| 6,446,605 | B1 | | 9/2002 | Fehrmann et al. | |
| 7,021,117 | B2 | * | 4/2006 | Cho | 73/1.73 |
| 7,069,171 | B2 | * | 6/2006 | Wang et al. | 702/145 |
| 2006/0150723 | A1 | * | 7/2006 | Delp et al. | 73/119 A |

FOREIGN PATENT DOCUMENTS

EP   1 653 067 A2   5/2006
EP   1 878 899 A1   1/2008

OTHER PUBLICATIONS

P. A. Samara, et al., "Detection of Sensor Abrupt Faults in Aircraft Control Systems", Proceedings of the 2003 IEEE International Conference on Control Applications., vol. 1, XP-010652043, Jun. 23, 2003, pp. 1366-1371.
International Search Report issued Jun. 18, 2009, in PCT/FR2009/050099.

* cited by examiner

Primary Examiner — Stephen K Cronin
Assistant Examiner — John Zaleskas
(74) Attorney, Agent, or Firm — Oblon, Spivak, McClelland, Maier & Neustadt, L.L.P.

(57) ABSTRACT

The present invention relates particularly to a method for detecting electric power blips during transmission of an electric signal representative of a magnitude detected by a sensor (1) to an electronic control unit associated with a motor, characterized in that it includes the steps of: a) measuring said electric signal known as "raw signal" (SBTE); b) proceeding with the filtering of said raw signal to obtain a "filtered signal" (STFE); c) calculating for a constant time pitch, |raw signal−filtered signal|, that is, the absolute value of the difference between the raw signal and the filtered signal; d) comparing said absolute value to a predetermined threshold of maximum variation (SVM); e) when said absolute value is greater than said predetermined threshold of maximum variation, declaring a state of power blip; f) otherwise, repeating the preceding steps.

11 Claims, 2 Drawing Sheets

METHOD FOR DETECTING ELECTRIC POWER BLIPS AND MANAGING THE OPERATION OF A MOTOR

BACKGROUND

The present invention relates to a method for detecting dropouts in the transmission of electric information representative of a magnitude detected by a sensor to an electronic control unit associated with an internal combustion engine or electric motor for example, notably for a motor vehicle.

It also relates to a method for managing the operation of an internal combustion engine which uses the foregoing method.

The technical field to which the present invention relates is that of engine control. "Engine control" is the system for managing an engine with all of its sensors, actuators and inter-system links (LIS). All of the laws of command control (software strategies) and of the characterization parameters (calibrations) of an engine are contained in a computer called the ECU (electronic control unit).

DESCRIPTION OF THE RELATED ART

One of the parameters used by the ECU is the temperature of the engine. It is used at the same time to correct many strategy parameters in order to ensure the correct operation of the engine and to comply with the emissions standards for combustion engines, but also to protect the engine against possible overheating.

In the rest of the present description, a description will be given of the case of detecting a fault concerning the engine temperature. It involves a detection of a fault by a strategy of monitoring engine-cooling temperature information.

However, the present invention can apply to other magnitudes such as the oil temperature, the pressure in a chamber of the engine, etc.

In order to ensure an optimal operating temperature for the engine and also to minimize the emissions of pollutants in the case of an internal combustion engine (MCI), a temperature set point is chosen for the engine and is regulated by a standalone and/or controlled thermostat or by a valve regulation system.

A sensor of the temperature of the cooling liquid is installed on the engine and makes it possible to have an image of the engine temperature by measuring the temperature of the cooling liquid. This temperature measurement is used as the input for the ECU strategies.

As shown in the appended FIG. 1, this sensor 1 is enclosed in a protective capsule ensuring at the same time a correct measurement of the temperature of the cooling liquid with which it is in contact. Another portion of the sensor 1 is exposed to the air and has a connector system 2 in order to be able to transmit electric information representative of the temperature of the cooling liquid. This connector system is itself linked to a portion of the wiring loom 3 which connects it to the connector system 4 of the injection computer contained in the ECU. It is this computer which uses this electric information via, amongst other things, a software linearization which converts this electric signal into a physical magnitude of temperature of the cooling liquid. This temperature is used by the ECU which transmits it to the other computers which also use this temperature.

Reference 5 indicates the input stage of the computer and analog/digital converter.

In this figure, the symbols used have the following meaning:
Rctn: resistance of the temperature sensor, of the NTC type (that is to say negative temperature coefficient),
Rpu: "pull-up" resistance, that is to say pull-up resistance connected to the "+" terminal of a stabilized power supply,
Rf: filtering resistance,
Ce: input capacity,
Cf: filtering capacity,
A/D: analog/digital converter, The temperature measurement is first of all electrical information and can exhibit interference which is not diagnosed electrically, but interpreted directly as a temperature. The measured temperature may therefore be incorrect without it being recognized as such by the injection computer.

Consequently, the corrections applied via the cooling temperature may be too much or not enough and measurements have shown that the apparent temperature, that is to say that given by the measurement of the sensor, is often lower than the reality.

A temperature that is lower than the real temperature may have the following consequences.

In the first place, a bad estimate of the losses by friction of the engine: one of the main items of information for estimating the losses related to the engine is the engine temperature and these losses can represent several tens of absolute N.m. An overestimate of the losses may therefore be present.

In the second place, regulation of idle speed: an incorrect estimate of losses disrupts the open loop of the compensations of the idle speed as a function of the temperature and may correct the idle speed to too high a value.

Moreover, for extreme cases relating to diesel engines, the regeneration of the particle filter may be aborted by the programmable controller for supervising the latter. Specifically, too low a water temperature will lead to regeneration outputs that are unjustified and uncontrolled (that is to say without declaration of failure or success, without actualization of the weight of the particle estimator).

For a gasoline engine, an overcorrection of the ignition advance (a correction corresponding to a cold temperature estimate while the engine is in a hot operating zone) causes pinking which may be harmful for the engine.

FIG. 2 shows a curve of linearization of the voltage, a function of the temperature read by the sensor. It is this temperature that is read by the ECU. The voltage is read at the input of the analog/digital converter and is converted into a physical magnitude after linearization (temperature).

Three voltage zones are defined on this curve, namely: a useful zone 6 and two diagnostic zones (CCground and CO/CC+ zones) 7 and 8 to which an electric fault detection correspond.

Zone 8 is called "CO/CC+" for "open circuit/short circuit to power supply positive", while the zone 7 is called "CCground" for "short circuit to ground".

A voltage too close to +5 volts (open circuit or short circuit to positive 5 volts power supply) or to ground (short circuit to ground) makes it possible to detect that the voltage is moving away from the useful zone and therefore to deduce an electric failure (disconnection or short circuit in the wiring). The consequence is that it is no longer possible to measure the temperature.

This detection mode however has limits.

Therefore, a temperature that is unstable or moved but which remains in the useful zone is not detected electrically.

There are also water temperature models that make it possible to make a correlation between measured temperature and estimated temperature. But either the model requires information that is not available in a vehicle, or the model is too simplistic and does not make it possible to correctly detect a fault when the signal from the sensor remains in the useful zone.

Moreover, document EP-A-1 653 067 describes a method for detecting the abnormal operation of a sensor of the temperature of the cooling liquid of an engine. An abnormal operation is detected when, after the engine is started, the detected temperature is below that detected just at the moment of starting.

Such a technique, like the foregoing, does not allow the detection of electrical dropouts in the transmission of the electric information originating from the measurement of the sensor.

BRIEF SUMMARY

An object of the invention is therefore to propose a method which allows the detection of such dropouts.

Another object is to provide a method for managing the operation of an engine which takes account of such a detection.

A first aspect of the invention therefore relates to a method for detecting electrical dropouts during the transmission of an electric signal representative of a magnitude detected by a sensor to an electronic control unit associated with an engine.

It is noteworthy in that it comprises the steps which consist in:

a) measuring said electric signal called "raw signal";

b) filtering said raw signal so as to obtain a "filtered signal";

c) calculating, for a constant time pitch, |raw signal−filtered signal|, that is to say the absolute value of the difference between the raw signal and the filtered signal;

d) comparing said absolute value with a predetermined threshold of maximum variation;

e) when said absolute value is higher than said predetermined threshold of maximum variation, declaring a dropout state;

f) otherwise, reiterating the preceding steps.

By virtue of this method, the electric dropouts which hitherto were not detected are detected and can then be considered as anomalies.

According to various advantageous features of this method:

in step b), the filtering consists in comparing the speed of change of said signal with a predefined maximum speed, and in assigning to said filtered signal, if the speed of change of the signal is faster than the maximum speed (SFTE), a predefined value which corresponds to said predefined maximum speed;

in step e), an elementary fault counter is incremented, and a dropout state is declared when this counter reaches a predetermined value.

A second aspect of the invention relates to a method for managing the operation of an engine, the latter comprising at least one sensor for measuring a characteristic magnitude of said engine, and electric means for transmitting an electric signal representative of said magnitude detected by the sensor, to an associated electronic control unit capable of interfering in the operation of said engine.

It is noteworthy in that it incorporates the use of the method as defined above.

According to various advantageous features of this method:

in step e), a dropout state is declared and a predetermined value or a predetermined change of values, called degraded mode, is assigned to said magnitude;

said predetermined value or predetermined change of values is defined by means of a computer model associated with the electronic control unit;

the information relating to the transition to degraded mode is retained in memory in the electronic control unit, even after the engine is switched off;

said degraded mode is maintained until the engine is switched off;

said magnitude is the temperature of the liquid for cooling the engine;

said magnitude is the temperature of the oil of the engine;

the engine is a combustion engine and said magnitude is the pressure prevailing in a combustion chamber of said engine.

BRIEF DESCRIPTION OF THE DRAWINGS

Other features and advantages of the present invention will appear on reading the following description of a preferred embodiment. This description will be given with reference to the appended drawings in which.

DETAILED DESCRIPTION

Figure 1:
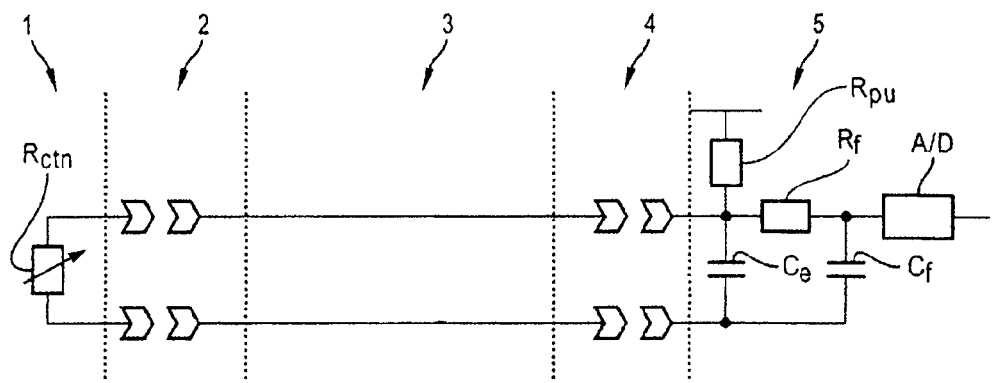
FIG. 1 is, as already mentioned above, a schematic diagram showing the means for connecting a sensor to the converter of an electronic control unit of an engine.
Figure 2:
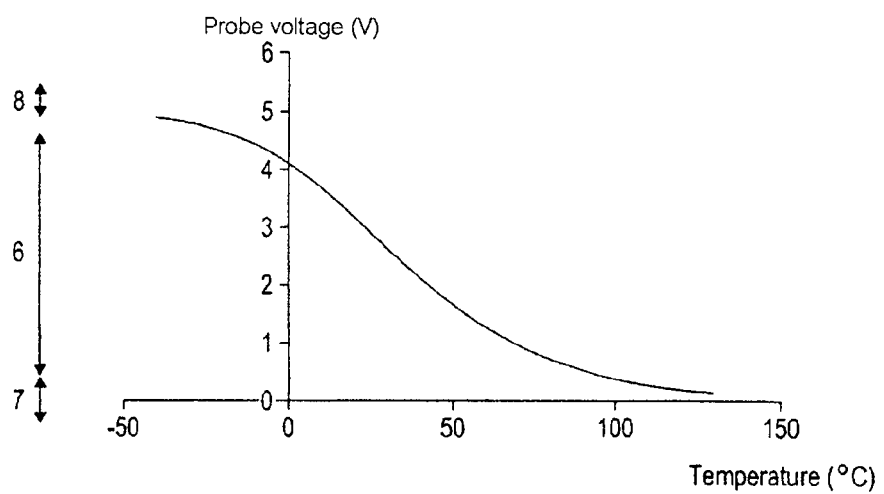
FIG. 2 is a voltage linearization curve, as a function of the temperature read by said sensor.
Figure 3:
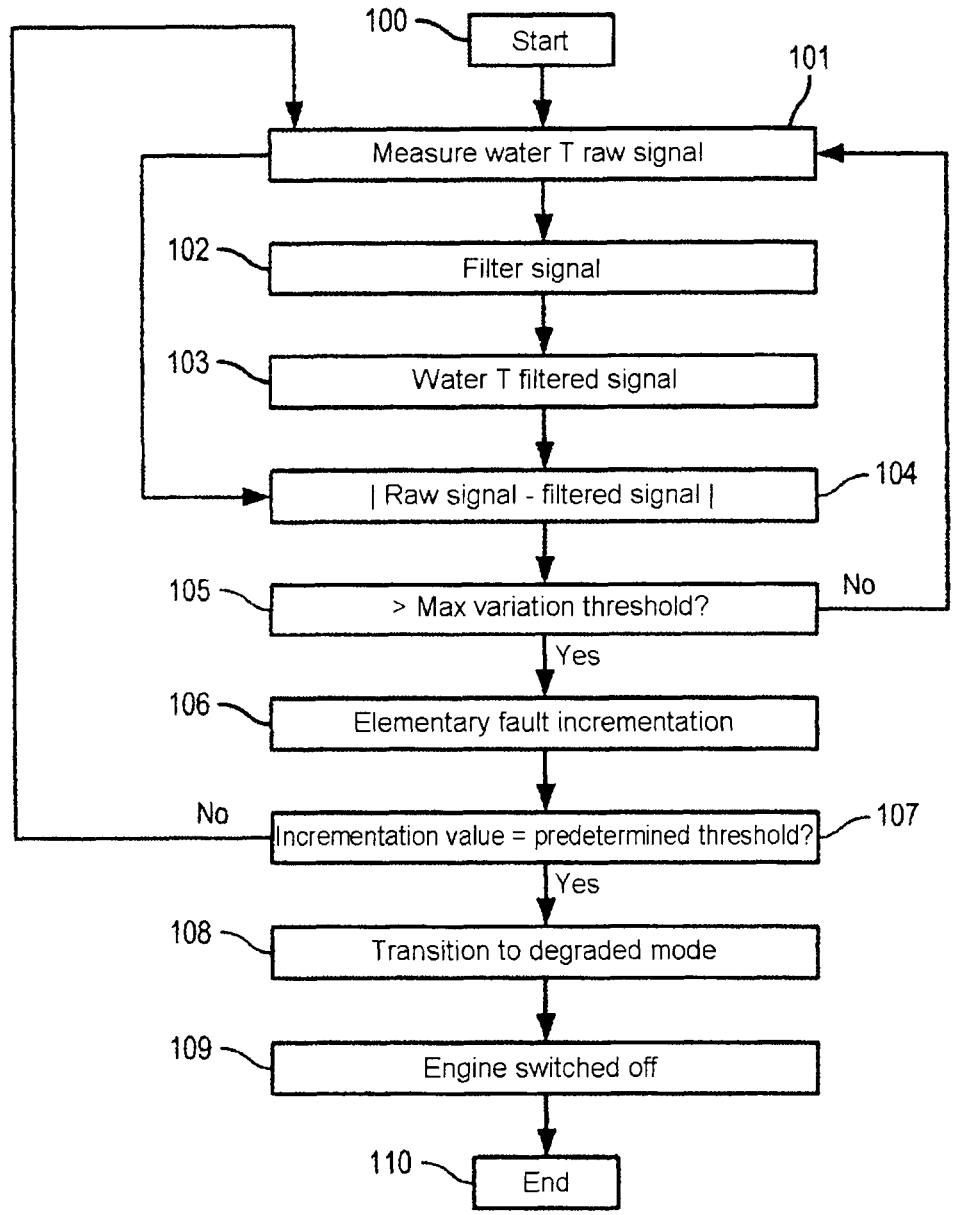
FIG. 3 is a block diagram illustrating the main steps of the method according to the invention.

After a prior step of activation of the method (block 100 of FIG. 3), the first step (step a) of the method for detecting dropouts according to the invention consists in measuring said electric signal originating from the sensor (block 101).

In the example shown here, this involves measuring the temperature of the cooling water of an internal combustion engine. However, this is only an example, the magnitude being able, for example, to be the temperature of the engine oil or the pressure prevailing in a combustion chamber of the engine, or else another magnitude of electrical origin. More generally, it is a magnitude specific to the engine and capable of being measured by a sensor.

The term "sensor" must also be understood as equally meaning "probe".

This signal is called "Water T Raw Signal" (abbreviated as SBTE).

The next step consists in filtering the previously measured SBTE signal (block 102).

This filtering is advantageously a "slew-rate", which consists in comparing the speed of change of said raw signal SBTE with a predefined maximum speed, and in assigning to the filtered signal "Water T Filtered Signal" (SFTE) a predefined value which corresponds to said predefined maximum speed.

The speed of change may be both a speed of increase and a speed of decrease in the temperature. And the maximum speed may be 1° C./s, for example.

Therefore, if the "raw" temperature varies too quickly, the "filtered" temperature reaches a predefined maximum value.

The absolute value of the difference between the two signals SBTE and SFTE, namely |SBTE−SFTE| (block 104) is then calculated.

This absolute value is then compared with a maximum variation threshold (SVM) the value of which is stored in the electronic control unit (ECU) of the engine (block 105).

In other words, we check whether the following relation (1) is verified:

$$|SBTE-SFTE|>SVM \qquad (1).$$

If the relation (1) is verified, a dropout state is then declared.

Otherwise, the preceding steps of the method are reiterated. Even on the assumption that the relation is verified, it is nevertheless possible to continue running this test, the result of which will have been stored.

This method achieves its full sense when it is used in the context of a method for managing the operation of an internal combustion engine. But it can be generalized to any type of engine.

Therefore, when the dropout state is declared, preferably an elementary fault electronic counter (CPE) is incremented or decremented (block 106).

When this counter has reached a predetermined value (VP), the ECU switches to "degraded mode" (block 108).

"Degraded mode" consists, for example, in switching to a replacement temperature that can be calibrated or is able to change, based, for example, on a water temperature model installed in the ECU.

This new temperature, even though it is less precise, makes sure that no overly serious consequences of the failure are caused (the consequences of which were mentioned at the beginning of the description).

On confirmation of the fault, a fault diagnostic message will be stored in the ECU and will therefore make it possible to help in the subsequent repair of the engine.

Moreover, for this type of fault, instead of coming out of degraded mode if the fault is cleared (as when there is a detection of the CCground type, for example), it is preferable to remain in degraded mode until the end of the running cycle.

Specifically, it is considered, in this case, that the information originating from the sensor is no longer objective and that, even if it returns to a more stable value, the latter is not necessarily a correct image of the real temperature.

It is therefore only during the next running cycle that the ECU will reuse the information originating from the sensor, if no new fault is detected.

Naturally, if the fault is detected but does not reappear, the latter remains stored in the ECU for a subsequent diagnosis at the garage, for example.

After the engine has been switched off (block 109), the method ends (block 110).

Assumed in the example that has just been described is a maximum speed of change of the signal with respect to the physical (bandwidth of the measurement in its context) in a cooling system for a combustion engine. If the signal varies too rapidly, it means that it is unstable and therefore no longer reflects the measurement that it is supposed to represent.

This principle may naturally be assumed for signals other than the water temperature, for example the engine oil temperature, a pressure signal, etc.

This principle may also be considered for an electric motor.

In the same manner, account must be taken of the environment of the sensor. Therefore, an air temperature will be more dynamic than a water temperature for example.

In addition to the environment, it is necessary to keep in mind the architecture of the cooling system which has an influence on the dynamics of the signal.

Therefore, for the example described here, this is the case if there is a hot or cold reserve (radiator) of cooling liquid, or on the assumption of various dynamic responses of certain actuators, such as a thermostat or a valve for example.

This instance relates to detection of dropouts, because it is a possible failure mode of a connector system in a vehicle for various reasons (ageing, connector system damaged or exposed to vibrations (engine environment), humidity, etc.).

But this diagnosis is more comprehensive and covers several phenomena. If it were a question purely of dropouts, the signal could reach its power supply voltage (in this instance 5 volts or very cold equivalent temperature such as during a CO (open circuit)) through the constant of filtering of the components of the input stage of the computer, but this case is not presented here. During a dropout, if the connector system is oxidized (presence of humidity+vibrations+electric voltage) the dropout can be seen from the ECU as a new added resistance relative to the temperature probe and therefore falsify the signal. This is the case when the signal suddenly takes a value around a new temperature range, noisy or not.

This way of detecting a fault remains a simple method (few calibrations and calculations). It makes it possible to avoid making use of a calibrated model for comparing the measurement to be diagnosed with this model which can quickly become complex, consume a lot of memory and other information originating from the sensor.

The invention claimed is:

1. A method for detecting electric dropouts during transmission of an electric signal representative of a magnitude detected by a sensor to an electronic control unit associated with an engine, comprising:
   a) measuring the electric signal as a raw signal;
   b) filtering the raw signal based on speed of change of the raw signal so as to obtain a filtered signal;
   c) calculating, for a constant time pitch, |raw signal−filtered signal|, as an absolute value of the difference between the raw signal and the filtered signal;
   d) comparing the absolute value with a predetermined threshold of maximum variation;
   e) when the absolute value is higher than the predetermined threshold of maximum variation, declaring a dropout state; and
   f) otherwise, reiterating the preceding operations, wherein in b) the filtering compares the speed of change of the signal with a predefined maximum speed, and assigns the filtered signal, if the speed of change of the signal is faster than the maximum speed, a predefined value which corresponds to the predefined maximum speed, and
   when the speed of change of the raw signal increases, the speed of change of the raw signal is compared with the predefined maximum speed, and
   when the speed of change of the raw signal decreases, the speed of change of the raw signal is compared with the predefined maximum speed.

2. The method as claimed in claim 1, wherein in e), an elementary fault counter is incremented or decremented, and a dropout state is declared when the counter reaches a predetermined value.

3. A method for managing operation of an engine, the engine including at least one sensor for measuring a characteristic magnitude of the engine, and electric means for transmitting an electric signal representative of the magnitude detected by the sensor, to an associated electronic control unit capable of interfering in the operation of the engine, the method incorporating the method as claimed in claim 1.

4. The method as claimed in claim 3, wherein, in e), a dropout state is declared and a predetermined value or a predetermined change of values, as a degraded mode, is assigned to the magnitude.

5. The method as claimed in claim 4, wherein the predetermined value or predetermined change of values is defined by a computer model associated with the electronic control unit.

6. The method as claimed in claim 4, wherein the degraded mode is maintained until the engine is switched off.

7. The method as claimed in claim 3, wherein the information relating to the transition to the degraded mode is retained in memory in the electronic control unit, even after the engine is switched off.

8. The method as claimed in claim 7, wherein even if a fault is cleared the degraded mode is retained until a new cycle of detecting electric dropouts during transmission of an electric signal is initiated.

9. The method as claimed in claim 3, wherein the magnitude is the temperature of a liquid for cooling the engine.

10. The method as claimed in claim 3, wherein the magnitude is temperature of oil of the engine.

11. The method as claimed in claim 3, wherein the engine is a combustion engine and the magnitude is pressure prevailing in a combustion chamber of the engine.

* * * * *